United States Patent [19]

Otsuki et al.

[11] Patent Number: 5,397,905
[45] Date of Patent: Mar. 14, 1995

[54] POWER SEMICONDUCTOR DEVICE HAVING AN INSULATED GATE FIELD EFFECT TRANSISTOR AND A BIPOLAR TRANSISTOR

[75] Inventors: Masahito Otsuki; Katsunori Ueno, both of Kawasaki, Japan

[73] Assignee: Fuji Electric Co., Ltd., Kanagawa, Japan

[21] Appl. No.: 196,835

[22] Filed: Feb. 15, 1994

[30] Foreign Application Priority Data

Feb. 16, 1993 [JP] Japan ................... 5-026440

[51] Int. Cl.⁶ .................. H01L 29/74; H01L 27/02
[52] U.S. Cl. .................. 257/133; 257/137; 257/146; 257/154; 257/155; 257/335; 257/337; 257/341; 257/378
[58] Field of Search ............... 257/133, 146, 154, 155, 257/335, 337, 341, 378, 137

[56] References Cited

U.S. PATENT DOCUMENTS

| Re. 32,784 | 11/1988 | Nakagawa et al. | |
| 4,821,095 | 4/1989 | Temple | |
| 5,200,638 | 4/1993 | Kida et al. | 257/133 |
| 5,245,202 | 9/1993 | Yasukazu | 257/378 |
| 5,304,802 | 4/1994 | Kumagai | 257/133 |

FOREIGN PATENT DOCUMENTS

| 0581246A2 | 2/1994 | European Pat. Off. |
| 3823270A1 | 3/1989 | Germany |
| 63-211675 | 9/1988 | Japan |
| 1-238171 | 9/1989 | Japan |
| 1-258473 | 10/1989 | Japan |
| 2-44776 | 2/1990 | Japan |
| 3-145163 | 6/1991 | Japan |
| 2156151A | 10/1985 | United Kingdom |

OTHER PUBLICATIONS

Ajit et al., "The Minority Carrier Injection Controlled Field-Effect Transistor (MICFET); A New MOS-Gated Power Transistor Structure." IEEE Transactions on Electron Devices, vol. 39, No. 8, Aug. 1992, pp. 1955-1960.

*Primary Examiner*—Ngan V. Ngo
*Attorney, Agent, or Firm*—Finnegan, Henderson, Farabow, Garrett & Dunner

[57] ABSTRACT

In a semiconductor device having insulated gate field effect transistors and bipolar transistors, a buried layer of a first conductivity type having an impurity concentration higher than that of a second layer of the first conductivity type is disposed in at least a lower region between a second layer of a second conductivity type and a third layer of the second conductivity type and in the vicinity of a boundary between the second layer of the first conductivity type, which serves as back gates of the field effect transistors and base layers of the bipolar transistors, and the first layer of the second conductivity type.

4 Claims, 7 Drawing Sheets

POWER SEMICONDUCTOR DEVICE HAVING AN INSULATED GATE FIELD EFFECT TRANSISTOR AND A BIPOLAR TRANSISTOR

BACKGROUND OF THE INVENTION

The present invention relates to a power semiconductor device, and more particularly to a power semiconductor device having an insulated gate field effect transistor and a bipolar transistor.

In recent years, power semiconductor devices having advantages to be easily driven and to be able to handle a large current, i.e., power semiconductor devices equipped with the features of both an insulated gate field effect transistor and a bipolar transistor, have been used as power semiconductor devices used for inverters and the like.

Figure 8A:
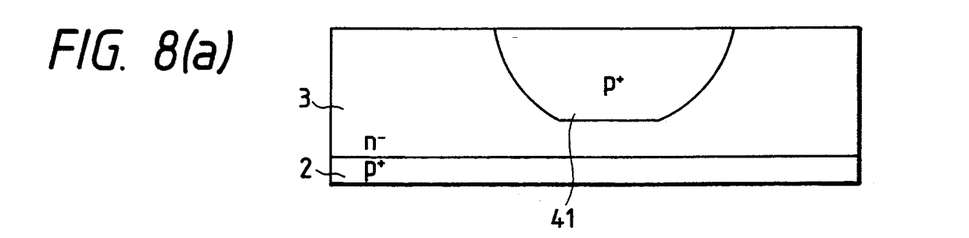
FIGS. 8(a) to 8(d) are cross-sectional views explaining a method of manufacturing a semiconductor device in accordance with a comparison example.
Figure 9:
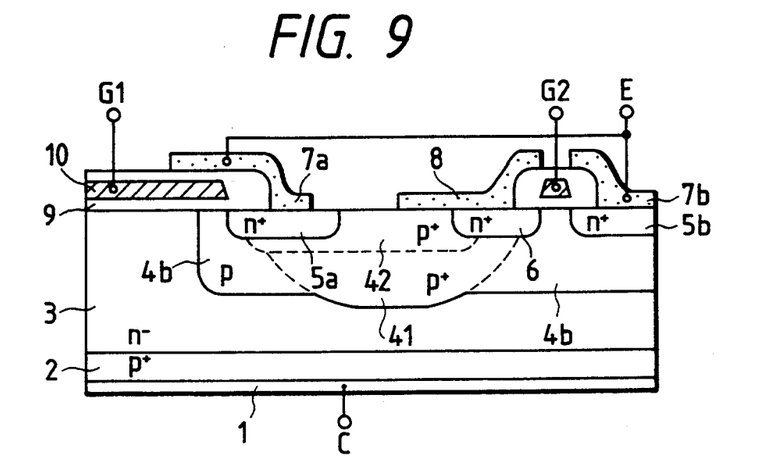
FIG. 9 is a cross-sectional view explaining a semiconductor device in accordance with the comparison example.
Figure 10A:
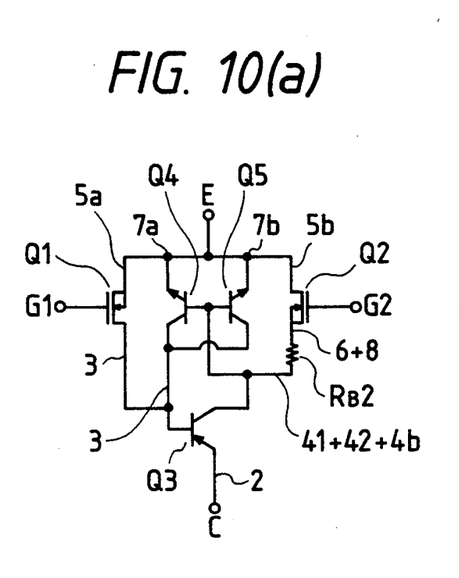
FIGS. 10(a) and 10(b) are circuit diagrams explaining an equivalent circuit of the semiconductor device in accordance with the comparison example.
Figure 10B:
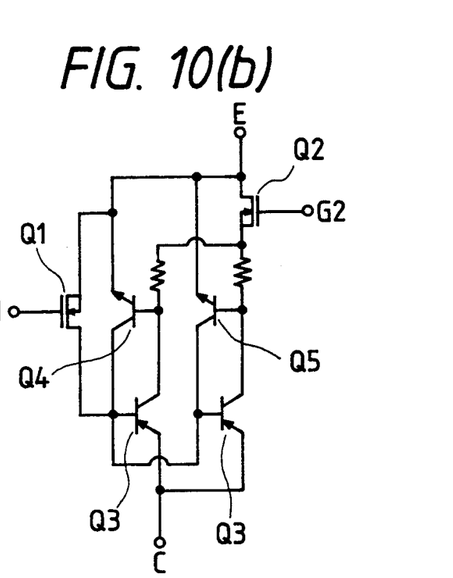

As one of the above power semiconductor devices, FIGS. 10(a) and 10(b) show an equivalent circuit of a semiconductor device which is disclosed in U.S. application Ser. No. 08/096,978 filed by the same inventors as the present application. This semiconductor device has major portions that are shown in a cross-sectional view in FIG. 9, and is formed as shown in FIGS. 8(a) to 8(d) and FIG. 9. Namely, as shown in FIG. 8(a), a semiconductor substrate in which an $n^-$-type layer 3 is epitaxially grown on a $p^+$-type layer 2 is prepared. Subsequently, to reduce resistance in a p-type layer 4b serving as a base layer of second and third bipolar transistors (hereafter referred to as Q4 and Q5) which are formed later, a $p^+$-type diffused layer 41 is formed in a region where the p-type layer 4b is to be formed, down to a depth which reaches a vicinity of an interface between the p-type layer 4b and the $n^-$-type layer 3 by selectively injecting boron from the surface of the $n^-$-type layer 3 and by allowing thermal diffusion to take place.

Figure 8B:
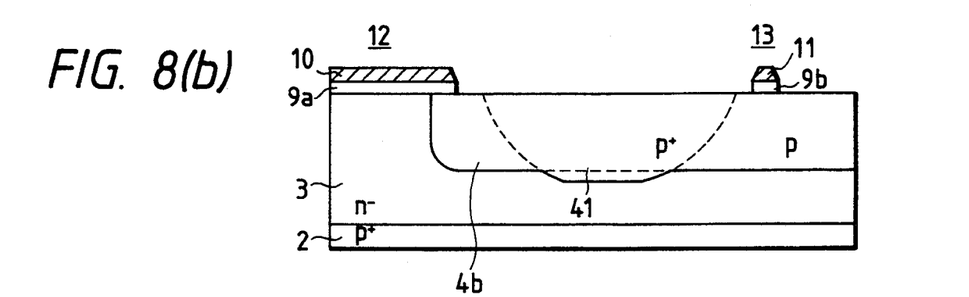

Then, as shown in FIG. 8(b), after an insulating film and a gate electrode (polysilcon film) are formed one on top of the other, the gate electrode is subjected to patterning, thereby forming first and second electrodes 10 and 11 serving as gate electrodes G1 and G2 of first and second insulated gate field effect transistors (hereafter referred to as Q1 and Q2) on the insulating film. Subsequently, by using the first and second electrodes 10 and 11 as masks, the insulating film is subjected to etching, thereby forming gate oxide films 9a and 9b beneath the first and second electrodes 10 and 11, respectively. At this time, the first and second electrodes 10 and 11 are formed in such a manner that semiconductor regions below the first and second electrodes 10 and 11 and ends which cross the surfaces of the $p^+$-type high-concentration layer 41 and a $p^+$-type diffused layer 42 do not overlap with each other, respectively. This is because if the concentration at surface portions of a channel layer located immediately below the gate electrodes constituted by the first and second electrodes 10 and 11 is too high, threshold values of MOS 12 or MOS 13 rise, which is not desirable.

Subsequently, by using the first and second electrodes 10 and 11 as masks, boron is injected selectively into the surface of the $n^-$-type layer 3 and is allowed to diffuse, thereby forming the p-type layer 4b. At this time, in the $n^-$-type layer 3 below the ends of the first and second electrodes, the p-type layer 4b extends by a predetermined distance below the first and second electrodes 10 and 11 by means of lateral diffusion. In the portion of the $n^-$-type layer 3 located below the second electrode 11, since the width of the second electrode 11 is small, the p-type layers 4b extending from both ends of the second electrode 11 become connected to each other, so that this entire portion becomes the p-type.

Figure 8C:
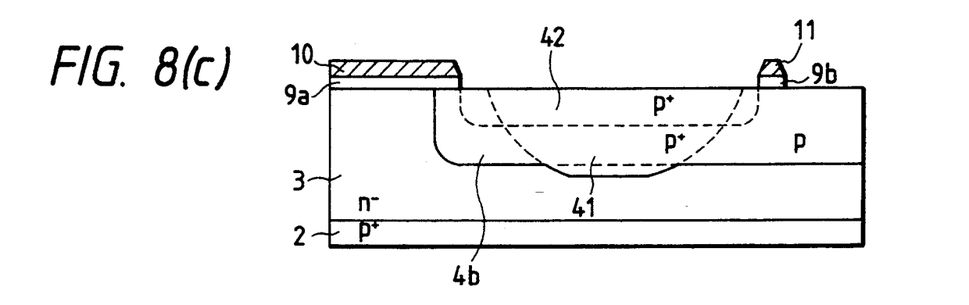

Next, in order to further reduce the resistance at the p-type layer 4b and obtain satisfactory ohmic contact with the electrodes, the $p^+$-type layer 42 is formed as shown in FIG. 8(c). As for its procedure, in the same way as the formation of the $p^+$-type layer 41, boron is injected selectively into the surface of the $n^-$-type layer 3 and is allowed to diffuse, thereby forming the $p^+$-type diffused layer 42 in substantially the same planar region as the $p^+$-type diffused layer 41 so as to be provided with a depth smaller than the depth of the $p^+$-type diffused layer 41.

Figure 8D:
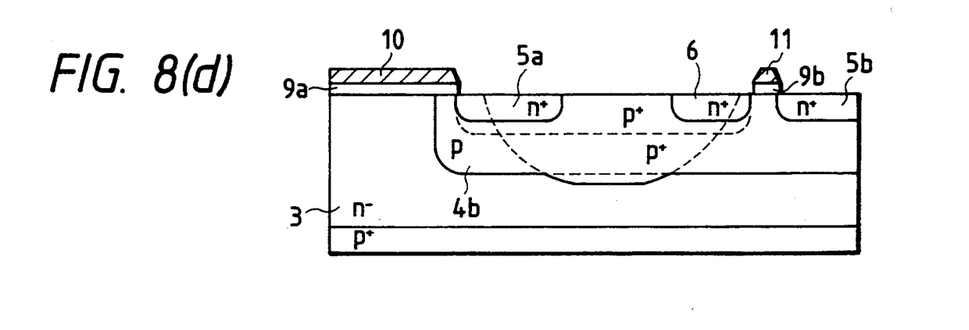

Next, as shown in FIG. 8(d), by using as masks the first and second electrodes 10 and 11 and resist films (not shown) formed selectively in the vicinities of central portions of the surface areas of the $p^+$-type diffused layer 41 and the $p^+$-type diffused layer 42, arsenic or phosphorus is vapor-phase diffused or ion injected and is allowed to diffuse or recrystallize, thereby forming $n^+$-type layers 5a, 6, and 5b. At this time, in a portion of the p-type layer 4b which is located below an end of the first electrode 10, the $n^+$-type layer 5a enters slightly below the first electrode 10 by means of lateral diffusion. As a result, a portion of the p-type layer 4b which is located below the first electrode 10 and extends from the end of the $n^+$-type layer 5a to the $n^-$-type layer 3 becomes a channel forming layer. At the ends of the second electrode 11, the $n^+$-type layers 6 and 5b enter slightly below the second electrode 11 from the both ends. As a result, a portion of the p-type layer 4b which is located below the second electrode 11 and sandwiched between the $n^+$-type layers 6 and 5b becomes a channel forming layer.

Subsequently, as shown in FIG. 9, the first and second electrodes 10 and 11 are insulated by an insulating film, thereby forming third and fourth electrodes 7a and 7b respectively connected to the $n^+$-type layers 5a and 5b as well as a fifth electrode 8 for shortcircuiting the $n^+$-type layer 6 and the p-type layer 42. Then, a sixth electrode 1 is formed on the other surface of a $p^+$-type layer 2.

The relationships between the thus fabricated semiconductor device shown in FIG. 9 and portions of the equivalent circuit shown in FIG. 10 are as follows: Namely, the $p^+$-type layer 2 becomes an emitter layer of a first bipolar transistor (hereafter referred to as Q3), and the sixth electrode 1 becomes a collector electrode 1 in the overall semiconductor device. In addition, the first $n^-$-type layer 3 becomes a first source/drain region layer (hereafter referred to as the S/D region layer) of Q1, a base layer of Q3, and a collector layer of Q4 and Q5. The p-type layer 4b becomes a back gate of Q1 and Q2, a collector layer of Q3, and a base layer of Q4 and Q5.

Furthermore, the $n^+$-type layer 5a becomes a second S/D region layer of Q1 and an emitter layer of Q4; the $n^+$-type layer 6 becomes a first S/D region layer of Q2; and the $n^+$-type layer 5b becomes a second S/D region layer of Q2 and an emitter layer of Q5.

In addition, the first electrode 10 and the second electrode 11 become gate electrodes of Q1 and Q2, respectively; the third electrode 7a serves as both a second source/drain electrode (hereafter referred to as the S/D electrode) of Q1 and an emitter electrode of Q4; and the fourth electrode 7b serves as both a second S/D electrode of Q2 and an emitter electrode of Q5.

In particular, in the above-described semiconductor device, since the p+-type diffused layer 41 is formed to reduce resistance $R_{B2}$ at the base layer of Q4 and Q5, in particular, it is possible to improve an upper-limit current (a controllable current) where a latch-up of a parasitic thyristor occurs.

Next, referring to FIGS. 9 and 10(a) and 10(b), the operation of the semiconductor device fabricated in the above-described manner will be described.

(1) When the transistor operation is performed, as shown in FIG. 10(a), a positive potential is applied to both the gate electrode (G1) 10 of Q1 and the gate electrode (G2) 11 of Q2 with respect to a common terminal E connected to the second S/D region layer 5a of the n-channel MOS transistor Q1, the second S/D region layer 6 of the n-channel MOS transistor Q2, the emitter electrode 7a of the npn bipolar transistor Q4, and the emitter electrode 7b of the npn bipolar transistor Q5.

Consequently, Q1 and Q2 are turned on. When Q1 is turned on, electrons flow from the first S/D electrode 7a to the second S/D region layer (the emitter layer of Q4) 5a, pass through the channel layer of Q1, and flow into the first S/D region layer (the base layer of Q4) 3. At the same time, the potential at the first S/D region layer (the base layer of Q4) declines. As a result, the pnp bipolar transistor Q3 comprised of the p-type layer (the collector layer of Q3) 4b, the n⁻-type layer (the base layer of Q3) 3, and the p+-type layer (emitter layer) 2 is turned on.

Then, a hole current passes through the emitter layer 2 of Q3, the base layer 3 of Q3, and the collector layer of Q3, and is drawn to the shortcircuiting electrode 8. Here, a current carrier shifts from holes to electrons, and an electron current flows into the first S/D region layer 6, passes through the channel layer of the already turned-on Q2 and the emitter layer 5b, and is drawn to the emitter electrode 7b.

(2) Next, when the thyristor operation is performed, as shown in FIG. 10(b), a positive potential is applied to the gate electrode (G1) 10 of Q1 with respect to the common terminal E connected to the second S/D region layer 5a of Q1, the second S/D region layer 6 of Q2, the emitter electrode 7a of Q4, and the emitter electrode 7b of Q5.

Consequently, Q1 is turned on. When Q1 is turned on, electrons flow from the first S/D electrode 7a to the second S/D region layer 5a, pass through the channel layer of Q1, and flow into the first S/D region layer (the base layer of Q3) 3. At the same time, the potential at the first S/D region layer (the base layer of Q3) declines. As a result, Q3 is turned on.

Then, holes pass from the emitter layer 2 and the base layer 3 of Q3 and are drawn to the collector layer (the base layer of Q4 and Q5) 4b, so that the potential at the base layer 4b of Q4 and Q5 becomes high. Here, since Q2 is not turned on, the holes are drawn from the base layer 4b of Q4 and Q5 to the emitter layers 7a and 7b of Q4 and Q5. As a result, Q4 and Q5 are turned on, and Q3 and Q4, as well as Q3 and Q5, operate as pairs, respectively, and the thyristor operation begins.

(3) When a shift is made from the above-described thyristor operation to the transistor operation, a high voltage is applied to the gate electrode (G2) of Q2 with respect to the terminal E with the voltage being applied to the gate electrode (G1) of Q1 and in a state in which Q1 is held in the on state, thereby turning on Q2. Consequently, holes are drawn from the base layer 4b of Q4 and Q5, electrons are introduced into the base 4b, and the potential at the base layer 4b of Q4 and Q5 declines, with the result that Q4 and Q5 are turned off. Accordingly, only Q1 and Q2 remain on, and the operation shifts to the transistor operation. It should be noted that, in this case, it is necessary to draw holes from the base of Q4 and Q5 via Q2 and to introduce the electrons into the base layer 4b. The switching speed is determined by that speed.

In the above-described operating state (1), since the emitter electrodes 7a and 7b are shortcircuited, the on voltage of the semiconductor device is expressed mainly as the sum of a junction voltage at a pn junction between the emitter layer 2 and the base layer 3 of Q3, an on voltage between the drain and source of Q1, and a voltage drop in the base layer 3. Meanwhile, a voltage which is equal to the sum of a voltage drop due to the composite resistance $R_{B2}$ in the base layer 4b and an on voltage between the drain and source of Q2 occurs between the base and the emitter of each of Q4 and Q5, both of which are thyristor-coupled to Q3. Here, the composite resistance $R_{B2}$ occurs within the base layer 4b, i.e., in a region layer extending from a portion below the channel layer of Q1 to a portion below the emitter layer 5a, and to a region layer which is surrounded by the emitter layer 5a and the first S/D region layer 6 and in which a main hole current flows.

Now, if a forward voltage of, for instance, 0.6 V or more, is applied between the base and the emitter of Q4 or Q5, Q4 or Q5 is turned on, so that the operation shifts to the thyristor operation with respect to Q3 and is set in a state which cannot be controlled by the gate. This is called a latch-up phenomenon.

Therefore, the p+-type diffused layer 41 and the p+-type diffused layer 42 are provided in the above-described semiconductor device in order to reduce $R_{B2}$ at the principal channel of the hole current so as to decrease the voltage applied between the base and the emitter of Q4 or Q5 for preventing the occurrence of the latch-up.

This is a method which is taken because the on voltage of Q1 and the on voltage of Q2 are in a relationship of tradeoff, and the concentration in the base layer 4b cannot be made very high in order to optimize a pn junction between the p-type base layer 4b and the n⁻-type base layer 3.

In accordance with the above-described comparison example, the principal hole current during the transistor operation passes in the base layer 4b of Q4, specifically from a portion below the region constituting the channel layer of Q1 to the p+-type diffused layer 42 via a portion below the emitter layer 5a of Q4 and the p+-type diffused layer 41, and is drawn to the shortcircuiting electrode 8. However, since the base layer 4b, the p+-type diffused layer 41 and the p+-type diffused layer 42 are all formed by the ion injection process, their concentrations are higher toward the surface, so that equivalent resistance is lower toward the surface, and the hole current flows in a portion close to the surface in a concentrated manner. This state is shown in FIG. 6(b) based on computer simulation by using an IGBT (conductivity-modulated transistor) as an example. As a result of the concentration of the current in this manner, as shown in an output characteristic diagram shown in FIG. 7, the collector current Ic is latched up at about 3000 A/cm². For this reason, a large main current value cannot be obtained during the transistor operation, so that there is a problem in that the above-described semiconductor device cannot be used for applications for which a greater current is required.

In addition, it takes time to draw the current carrier due to the concentration of the current, so that there is a problem in that the switching speed from the thyristor operation to the transistor operation is delayed.

SUMMARY OF THE INVENTION

Accordingly, the present invention was made to overcome the above-described problems, and its object is to provide a power semiconductor device having insulated gate field effect transistors and bipolar transistors, which is capable of preventing the concentration of the current in a region layer serving as a back gate and a base layer, and of reducing a voltage drop by reducing equivalent resistance in that region layer, thereby making it possible to prevent a latch-up during the transistor operation and further reducing a switching time from the thyristor operation to the transistor operation.

According to a first aspect of the present invention, a semiconductor device comprises a first layer 2 of a first conductivity type; a first layer 3 of a second conductivity type formed on the first layer 2 of the first conductivity type; a second layer 4b of the first conductivity type formed selectively in the first layer 3 of the second conductivity type; a second layer 5a of the second conductivity type formed selectively in a surface layer of the second layer 4b of the first conductivity type at a predetermined interval from an interface between the second layer 4b of the first conductivity type and the first layer 3 of the second conductivity type; a third layer 6 of the second conductivity type formed in the surface layer of the second layer 4b of the first conductivity type by being spaced apart from the second layer 5a of the second conductivity type; a fourth layer 5b of the second conductivity type formed in the surface layer of the second layer 4b of the first conductivity type at a predetermined interval from the third layer 6 of the second conductivity type; a first electrode 10 formed via an insulating film 9a on a surface of the second layer 4b of the first conductivity type disposed between the first layer 3 of the second conductivity type and the second layer 5a of the second conductivity type; a second electrode 11 formed via an insulating film 9b on the surface of the second layer 4b of the first conductivity type disposed between the third layer 6 of the second conductivity type and the fourth layer 5b of the second conductivity type; a third electrode 7a connected to the second layer 5a of the second conductivity type; a fourth electrode 7b connected to the third electrode 7a and connected to the fourth layer 5b of the second conductivity type; and a fifth electrode 8 connecting together the third layer 6 of the second conductivity type and the second layer 4b of the first conductivity type, wherein a buried layer 43 of the first conductivity type having an impurity concentration higher than that in the second layer 4b of the first conductivity type is provided in at least a lower region between the second layer 5a of the second conductivity type and the third layer 6 of the second conductivity type in a vicinity of a boundary between the second layer 4b of the first conductivity type and the first layer 3 of the second conductivity type.

According to a second aspect of the present invention, a semiconductor device according to the first aspect is characterized in that an impurity of the first conductivity type is introduced from the surface of the second layer 4b of the first conductivity type into the second layer 4b interposed between the second layer 5a of the second conductivity type and the third layer 6 of the second conductivity type to form an impurity-introduced layer 42 of the first conductivity type abutting at least the second layer 5a of the second conductivity type and the third layer 6 of the second conductivity type.

According to a third aspect of the present invention, a semiconductor device according to the first or second aspect is characterized in that the buried layer 4 of the first conductivity type has one end extending to a portion located below the first electrode 10 and another end extending to a portion located below the second electrode 11.

According to a fourth aspect of the present invention, a semiconductor device according to the first, second or third aspect is characterized in that the first layer 2 of the first conductivity type is an emitter layer of a first bipolar transistor Q3; the first layer 3 of the second conductivity type is a first source/drain region layer of a first insulated gate field effect transistor Q1, a base layer of the first bipolar transistor Q3, and collector layers of a second bipolar transistor Q4 and a third bipolar transistor Q5, respectively; the second layer 4b of the first conductivity type is back gates of the first insulated gate field effect transistor Q1 and a second insulated gate field effect transistor Q2, a collector layer of the first bipolar transistor Q3, and base layers of the second bipolar transistor Q4 and the third bipolar transistor Q5, respectively; the second layer 5a of the second conductivity type is a second source/drain region layer of the first insulated gate field effect transistor Q1 and an emitter layer of the second bipolar transistor Q4; the third layer 6 of the second conductivity type is a first source/drain region layer of the second insulated gate field effect transistor Q2; the fourth layer 5b of the second conductivity type is a second source/drain region layer of the second insulated gate field effect transistor Q2 and an emitter layer of the third bipolar transistor Q5; and the first and second electrodes 10 and 11 are gate electrodes of the first and second insulated gate field effect transistors Q1 and Q2, respectively.

In accordance with the above-described means, since the buried layer 43 of the first conductivity type having an impurity concentration higher than that in the second layer 4b of the first conductivity type is present in at least a lower region between the second layer 5a of the second conductivity type and the third layer 6 of the second conductivity type in the vicinity of a boundary between the second layer 4b of the first conductivity type and the first layer 3 of the second conductivity type, conductivity in the vicinity of the boundary between the second layer 4b of the first conductivity type and the first layer 3 of the second conductivity type drops below conductivity in the second layer 4b of the first conductivity type located above the buried layer 43 of the first conductivity type. Hence, the current flowing through the second layer 4b of the first conductivity type spreads in the entire second layer 4b of the first conductivity type as compared with a comparison example in which most of the current flows through an upper portion in proportion to an impurity concentration.

As a result, since the concentration of the current in the second layer 4b of the first conductivity type can be prevented, and an equivalent resistance $R_B$ can be reduced, it is possible to prevent a voltage drop in this region.

Accordingly, in a case where, for instance, the second layer 4b of the first conductivity type is used as base layers of the second and third bipolar transistors Q4 and Q5, it is possible to prevent a latch-up in which a thyristor comprised of Q4 and Q3 as well as Q5 and Q3 undergoes abnormal operation as Q4 and Q5 are turned on during the transistor operation when Q1 is turned on. In addition, since the current carrier remaining in the base layers of Q4 and Q5 can be drawn quickly, the switching time from the thyristor operation to the transistor operation when the above-described thyristor undergoes normal operation can be reduced further.

In addition, since the concentration of the current can be prevented more effectively and the equivalent resistance $R_B$ can be reduced by expanding a buried layer 43a of the first conductivity type to the lower side of Q1, it is possible to prevent a voltage drop in this region more effectively.

As a result, during the transistor operation, it is possible to prevent a latch-up more reliably, and the switching time from the thyristor operation to the transistor operation can be reduced further.

Furthermore, by expanding the buried layer 43a of the first conductivity type to the lower side of Q2, the current during the transistor operation can be dispersed, and the equivalent resistance $R_B$ can be reduced, so that it is possible to prevent a voltage drop in this region.

Consequently, it is possible to prevent a latch-up during the transistor operation, and the switching time from the thyristor operation to the transistor operation can be reduced further.

DETAILED DESCRIPTION OF THE PREFERRED EMBODIMENTS

Referring to the accompanying drawings, preferred embodiments of the present invention will now be described.

(First Embodiment)

Figure 1:
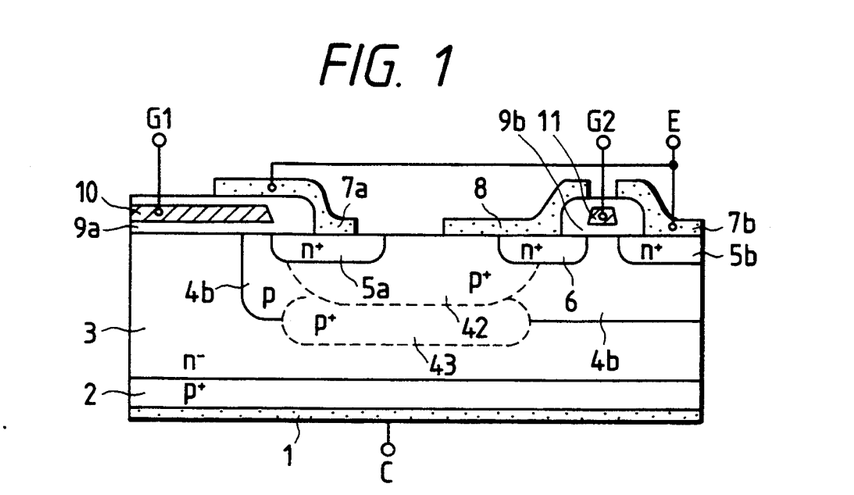
FIG. 1 is a cross-sectional view of essential portions for explaining a semiconductor device in accordance with a first embodiment of the present invention.
Figure 4A:
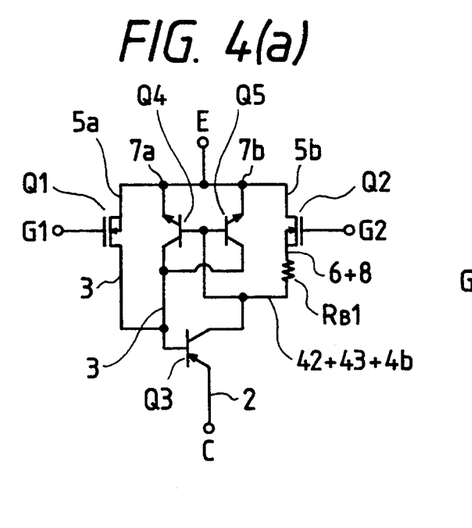
FIGS. 4(a) and 4(b) are circuit diagrams each explaining an equivalent circuit of the semiconductor device in accordance with the embodiment of the present invention.
Figure 4B:
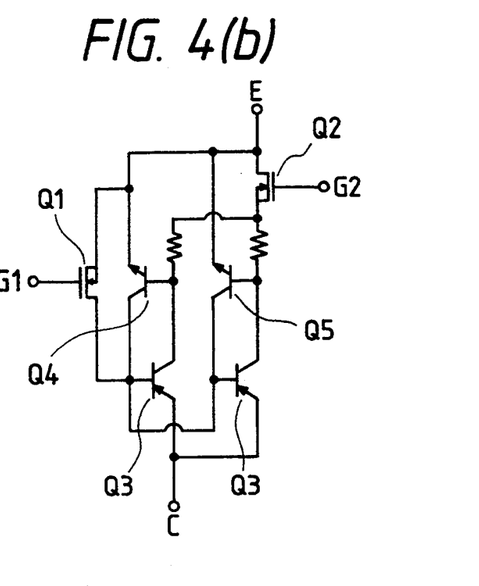

FIG. 1 is a cross-sectional view of essential portions of a semiconductor device in accordance with a first embodiment of the present invention, which has an equivalent circuit shown in FIGS. 4(a) and 4(b).

In FIG. 1, reference numeral 2 denotes a p+-type layer (a first layer of a first conductivity type) which serves as a collector layer of a first bipolar transistor (hereafter referred to as Q3), a collector electrode (sixth electrode) 1 being formed on one surface thereof. Numeral 3 denotes an n−-type layer (a first layer of a second conductivity type) formed on the p+-type layer 2, and this n−-type layer 3 serves as a first source/drain region layer (hereafter referred to as the S/D region layer) of a first insulated gate field effect transistor (hereafter referred to as Q1), a base layer of Q3, and a collector layer of a second bipolar transistor (hereafter referred to as Q4) and a third bipolar transistor (hereafter referred to as Q5).

Reference character 4b denotes a p-type layer (a second layer of the first conductivity type) formed selectively within the n−-type layer 3, and this p-type layer 4b serves as a back gate of Q1 and Q2, an emitter layer of Q3, and a base layer of Q4 and Q5.

Reference character 5a denotes an n+-type layer (a second layer of the second conductivity type) formed selectively in a surface layer within the p-type layer 4b at a predetermined interval from an interface between the p-type layer 4b and the n−-type layer 3, and this n+-type layer 5a serves as a second S/D region layer of Q1 and an emitter layer of Q4.

Reference numeral 6 denotes an n+-type layer (a third layer of the second conductivity type) formed in the surface layer within the p-type layer 4b in a spaced-apart relation with the n+-type layer 5a.

Reference character 5b denotes an n+-type layer (a fourth layer of the second conductivity type) formed selectively in the surface layer within the p-type layer 4b at a predetermined interval from the n+-type layer 6, and this n+-type layer 5b serves as the second S/D region layer of Q2 and an emitter layer of Q5.

Numeral 10 denotes a first electrode formed on the surface of the p-type layer 4b disposed between the n−-type layer 3 and the n+-type layer 5a, via an insulating film 9; and numeral 11 denotes a second electrode formed on the surface of the p-type layer 4b disposed between the n+-type layer 6 and the n+-type layer 5b, via the insulating film 9, and these first and second electrodes 10 and 11 serve as the gate electrodes of Q1 and Q2, respectively Reference character 7a denotes a third electrode connected to the n+-type layer 5a, and this third electrode serves as both a second source/drain electrode (hereafter referred to as the S/D electrode) of Q1 and an emitter electrode of Q4; and reference character 7b denotes a fourth electrode connected to the third electrode 7a and connected to the n+-type layer 5b, and this fourth electrode serves as both a second S/D electrode of Q2 and the emitter electrode of Q4. Numeral 8 denotes a fifth electrode for shortcircuiting the n+-type layer 6 and the p-type layer 4b.

Numeral 43 denotes a p+-type buried layer (a buried layer of the first conductivity type) formed in the vicinity of the interface between the n−-type layer 3 and the p-type layer 4b so as to reduce $R_{B1}$, and this p+-type buried layer 43 is formed in such a manner as to extend in a region between the n+-type layer 5a and the n+-type layer 6 and regions below the n+-type layer 5a and the n+-type layer 6, respectively. Numeral 42 denotes a p+-type diffused layer (a high-concentration layer of the first conductivity type) formed by introducing and thermally diffusing high-concentration boron into the p-type layer 4b between the n+-type layer 5a and the n+-type layer 6 from the surface of the p-type layer 4b so as to provide the electrodes with ohmic contacts and to reduce $R_{B1}$. This p+-type diffused layer 42 is located substantially in an upper portion of the same region as the p+-type buried layer 43, and is formed so as to be connected to the p+-type buried layer 43.

Next, referring to FIGS. 2(a) to 2(d), a method of manufacturing the semiconductor device shown in FIG. 1 will be described.

Figure 2A:
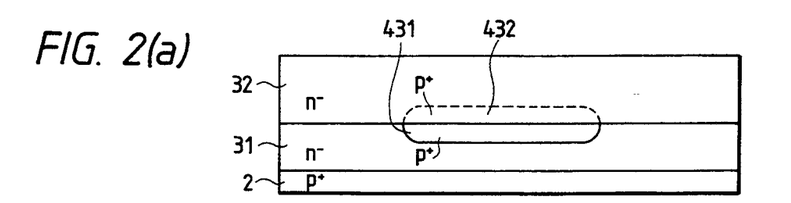
FIGS. 2(a) to 2(d) are cross-sectional views of the major portions in respective steps for explaining a method of manufacturing a semiconductor device in accordance with the first embodiment of the present invention.

First, as shown in FIG. 2(a), after a semiconductor substrate is prepared in which an n−-type layer 31 is formed on the p+-type layer 2 by means of epitaxial growth or the like, boron is ion injected selectively into the surface layer of the n−-type layer 31, and is diffused by performing heat treatment, thereby forming a p+-type high-concentration layer 431. Next, an n−-type layer 32 having substantially the same concentration as the n−-type layer 31 is formed by epitaxial growth. At this time, boron in the p+-type high-concentration layer 431 is diffused outwardly from the p+-type high-concentration layer 431 to the n−-type layer 32 by means of heating. As a result, a p+-type outwardly diffused layer 432 having a concentration distribution which is substantially symmetrical with the p+-type high-concentration layer 431 with respect to an interface between the n−-type layers 31 and 32 is formed in the n−-type layer 32. Since the p+-type high-concentration layer 431 is formed by the ion injection process, the impurity concentrations at the p+-type high-concentration layer 431 and the p+-type outwardly diffused layer 432 are the highest at the interface between the n−-type layers 31 and 32. As described above, the n−-type layer 3 and the p+-type buried layer 43 are formed.

Figure 2B:
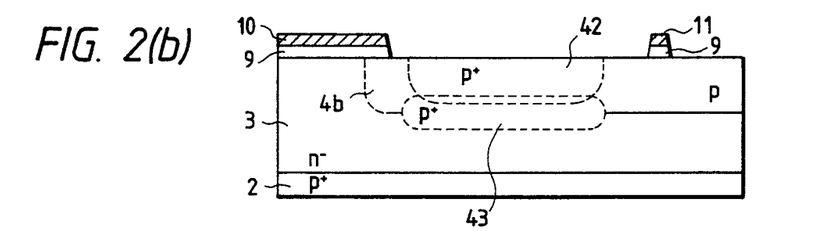

Next, as shown in FIG. 2(b), after a silicon oxide film (insulating film) serving as a gate insulating film is formed by thermal oxidation on the semiconductor substrate fabricated in the above-described manner, a polysilicon film is formed on the silicon oxide film. Subsequently, by using a resist pattern (not shown) as a mask, the polysilicon film is selectively removed by etching, thereby forming the first and second electrodes 10 and 11 serving as the gate electrodes of Q1 and Q2. Then, by using the first and second electrodes as masks, the silicon oxide film is selectively etched, thereby forming the gate oxide film (insulating film) 9 below the first and second electrodes 10 and 11 and providing an opening for a region where the p-type layer 4b is to be formed.

Subsequently, boron ions are injected into the surface of the n−-type layer 3 and are thermally diffused, thereby forming the p-type layer 4b. At this time, in the portions of the n−-type layer 3 located below ends of the first and second electrodes 10 and 11, the p-type layer 4b is made to extend by predetermined distances below the first and second electrodes 10 and 11 by means of lateral diffusion. Of these portions, in the portion of the p-type layer 4b located below the second electrode 11, since the width of the second electrode 11 is small, the p-type layers 4b extending from both ends of the second electrode 11 become connected together, so that this entire portion becomes the p-type.

Furthermore, to provide the electrodes with ohmic contacts, high-concentration boron is ion injected into the p-type layer 4b between the n+-type layer 5a and the n+-type layer 6 and is allowed to thermally diffuse, thereby forming the p+-type diffused layer 42. At this time, the p+-type diffused layer 42 which crosses the surface is formed in such a manner as not to overlap with the first and second electrodes 10 and 11 for the reason stated before.

Figure 2C:
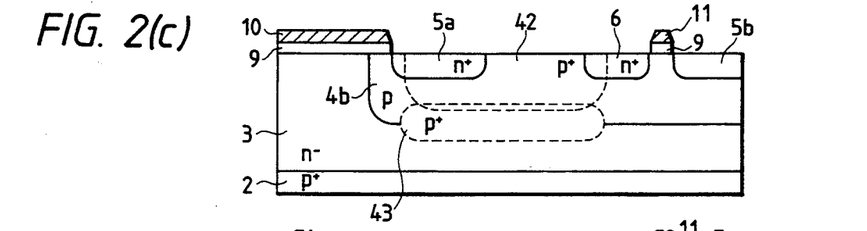

Then, as shown in FIG. 2(c), by using as masks a resist film (not shown) formed selectively near the center portion of the surface region of the p+-type diffused layer 42 and the p+-type buried layer 43 as well as the first and second electrodes 10 and 11, arsenic or phosphorus is vapor-phase diffused or ion injected and is allowed to diffuse, thereby forming the n+-type layers 5a, 6 and 5b. At this time, in the portion of the p-type layer 4b which is located below an end of the first electrode 10, the n+-type layer 5a enters below the first electrode 10 by means of lateral diffusion. As a result, the portion of the p-type layer 4b which is located below the first electrode 10 and extends between the end of the n−-type layer 3 and the end of the n+-type layer 5a becomes a channel forming layer. In addition, at the ends of the second electrode 11, the n+-type layers 6 and 5b enter below the second electrode 11 from the both ends. As a result, that portion of the p-type layer 4b which is located below the second electrode 11 and sandwiched between the n+-type layers 6 and 5b becomes a channel forming layer.

Figure 2D:
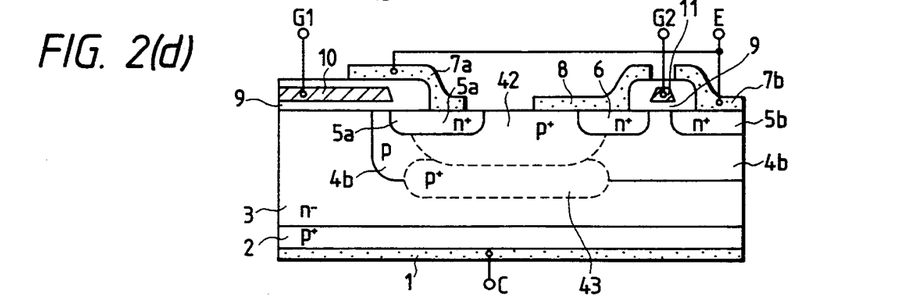

Subsequently, as shown in FIG. 2(d), after an oxide film is formed, the oxide film is selectively etched so as to coat the first and second electrodes 10 and 11. Then, an aluminum film is formed and is subjected to patterning, thereby forming the third and fourth electrodes 7a and 7b respectively connected to the n+-type layers 5a and 5b as well as the fifth electrode 8 for shortcircuiting the n+-type layer 6 and the p-type layer 4b. Subsequently, an aluminum film is vacuum deposited on the other surface of the p+-type layer 2 and is subjected to patterning, thereby forming the sixth electrode 1.

Next, referring to FIGS. 1, 4(a), (4b) and 5, the operation of the semiconductor device fabricated in the above-described manner will be described.

Figure 5:
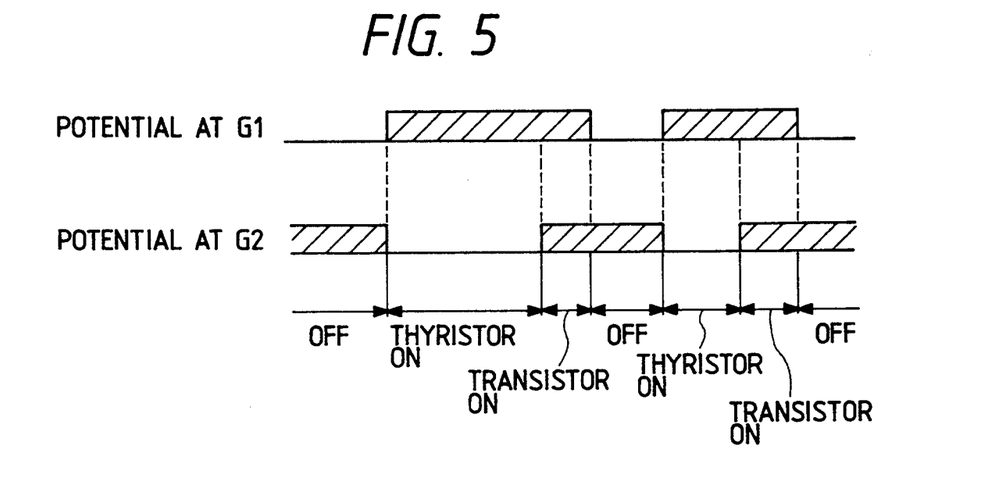
FIG. 5 is a timing chart explaining a method of operation of the semiconductor device in accordance with the embodiment of the present invention.

(1) As shown in FIG. 5, a positive potential is applied only to the gate electrode (G2) of Q2 so as to maintain the off state. As a result, Q2 is turned on, and the potential at the base layer 4b of Q4 and Q5 is lowered. Since Q4 and Q5 are thereby turned off, all of Q3 to Q5 are turned off together with Q3 which is already off.

(b) Then, as shown in FIG. 5, to turn on the device in the thyristor operation, Q2 is turned off by setting the potential at the gate electrode (G2) 11 of Q2 at the same level as the terminal E, and a positive potential is applied to the gate electrode (G1) 10 of Q1 with respect to the common terminal E connected to the second S/D region layer 5a of Q1, the second S/D region layer 5b of Q2, the emitter electrode 7a of Q4, and the emitter electrode 7b of Q5. Consequently, Q1 is turned on.

When Q1 is turned on, electrons flow from the third electrode 7a to the second S/D region layer (the emitter layer of Q4) 5a, pass through the channel layer of Q1, and flow into the first S/D region layer (the base layer of Q3) 3, so that the potential at the first S/D region layer (the base layer of Q3) declines. As a result, Q3 is turned on.

Then, holes pass from the emitter layer 2 of Q3 to the base layer 3 and are drawn to the collector 4b (the base layer of Q4). The potential at the base layer of Q4 becomes high, and since Q2 is not turned on, the holes in the base layer 4b of Q4 and Q5 are drawn from the base layer 4b of Q4 and Q5 to the emitter layers 5a and 5b of Q4 and Q5. As a result, Q4 and Q5 are turned on, and Q3 and Q4, as well as Q3 and Q5, operate as pairs, respectively, and the thyristor operation begins.

(c) To effect a shift from the above-described thyristor operation to the transistor operation, a high voltage is applied to the gate electrode (G2) of Q2 with respect to the terminal E, whereby both Q1 and Q2 are turned on, causing a decline in the potential at the base layer 4b of Q4 and Q5. Consequently, since Q4 and Q5 are turned off, only Q1 and Q2 remain turned on, so that the operation shifts to the transistor operation.

That is, since Q1 is turned on, the electrons flow from the emitter electrode 7a of Q4 to the emitter layer 5a, pass through the channel layer of Q1, and flow into the base layer 3 of Q3. As a result, the pnp bipolar transistor comprised of the collector layer (the base layer of Q4) 4b of Q3, the base layer 3 of Q3, and the emitter layer 2 of Q3 is turned on.

Then, the hole current passes through the emitter layer 2 of Q3, the base layer 3 of Q3, and the collector layer of Q3, and is drawn to the shortcircuiting electrode 8. Here, the current carrier shifts from holes to electrons, and the electrons flow into the first S/D region layer 6 of Q2, pass through the channel layer of the already turned-on Q2 and the emitter layer 5b, and is drawn to the emitter electrode 7b.

In accordance with the above-described semiconductor device, since the high-concentration p+-type buried layer 43 is formed in the base layer 4b of Q4 and Q5, the resistance $R_{B1}$ of the p+-type buried layer 43 in the base layer 4b becomes smaller than that of the surrounding portion. In particular, the resistance $R_{B1}$ of a central portion of the p+-type buried layer 43, which is a junction portion between the p+-type high-concentration layer 431 and the p+-type outwardly diffused layer 432, becomes the smallest as compared with that of the surrounding portion. As a result, the principal hole current during the transistor operation can be allowed to flow in an extensively diffused manner in the depthwise direction of the base layer 4b as compared with the conventional technique.

Figure 6A:
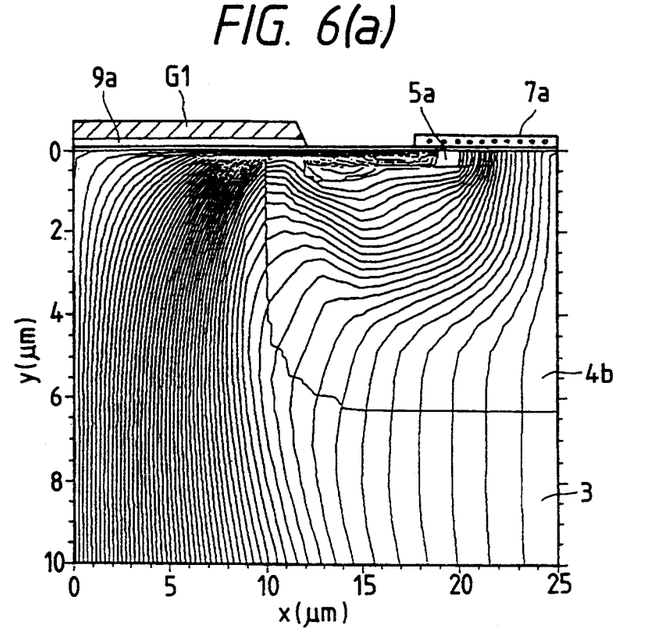
FIGS. 6(a) and 6(b) are cross-sectional views for comparison and explanation with respect to results of simulation of a current distribution flowing across the semiconductor device in accordance with the embodiment of the present invention.
Figure 6B:
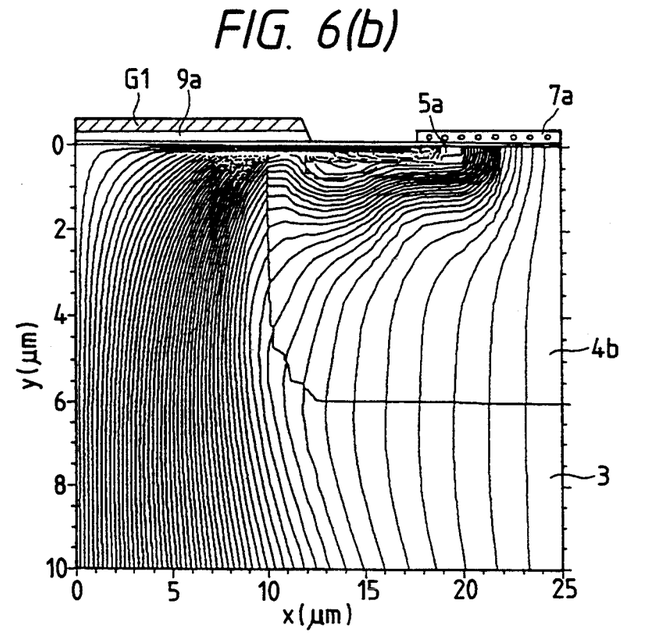
Figure 7:
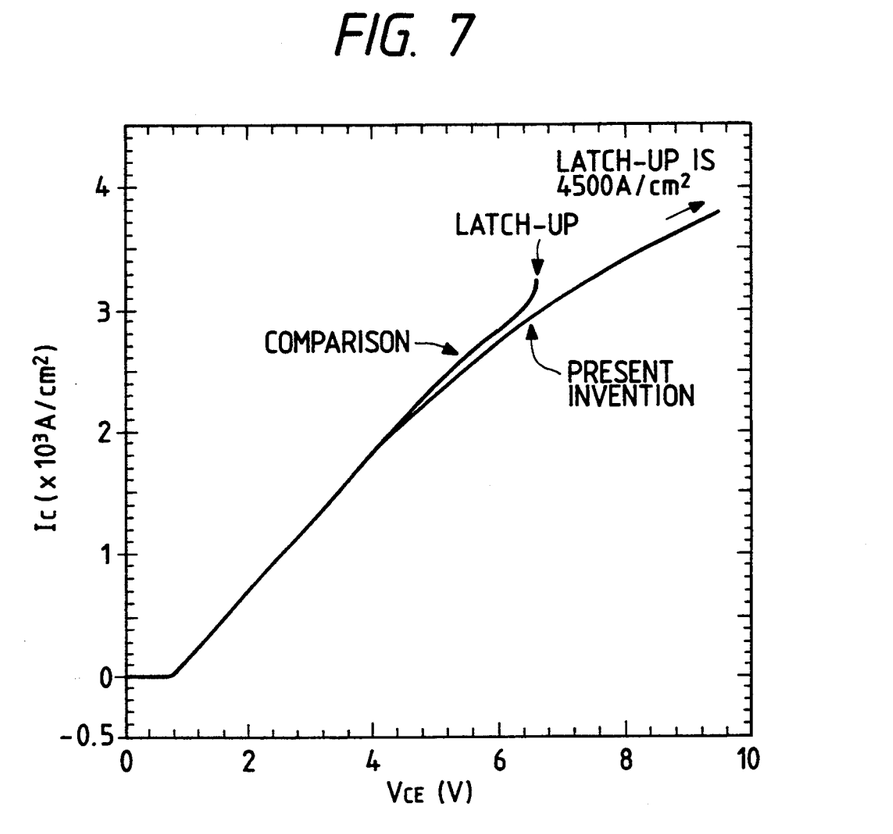
FIG. 7 is a diagram for comparison and explanation with respect to a latch-up withstanding capacity of the semiconductor device in accordance with the embodiment of the present invention.

FIG. 6(a) is a cross-sectional view in which the current flow in the base layer 4b of the transistor having the p+-type buried layer 43 is calculated by computer simulation and is illustrated. It can be appreciated that the current flow in FIG. 6(a) is enlarged in the downward direction as compared with FIG. 6(b) which illustrates a comparison case. In addition, FIG. 7 illustrates an output characteristic of the semiconductor device which was actually fabricated. According to this drawing, the latch-up withstanding capacity in accordance with this embodiment is 4500 A/cm², which is 1.5 times as large as that of the comparison technique.

As described above, in accordance with the semiconductor device of the first embodiment of the present invention, since the high-concentration p+-type buried layer 43 is formed in the base layer 4b of Q4 and Q5, the principal hole current during the transistor operation can be allowed to flow in an extensively diffused manner in the depthwise direction of the base layer 4b as compared with the comparison technique.

Consequently, since the concentration of the current in the base layer 4b of Q4 and Q5 can be prevented and the equivalent resistance $R_{B1}$ can be reduced, it is possible to prevent a voltage drop in the base layer 4b. Accordingly, it is possible to prevent a latch-up in which the thyristor comprised of Q4 and Q3 as well as Q5 and Q3 undergoes abnormal operation as Q4 and Q5 are turned on during the transistor operation when Q1 is turned on. In addition, since the current carrier remaining in the base layer 4b of Q4 and Q5 can be drawn quickly, the switching time from the thyristor operation to the transistor operation when the above-described thyristor undergoes normal operation, as shown in FIG. 4(b), can be reduced further.

(Second Embodiment)

Figure 3:
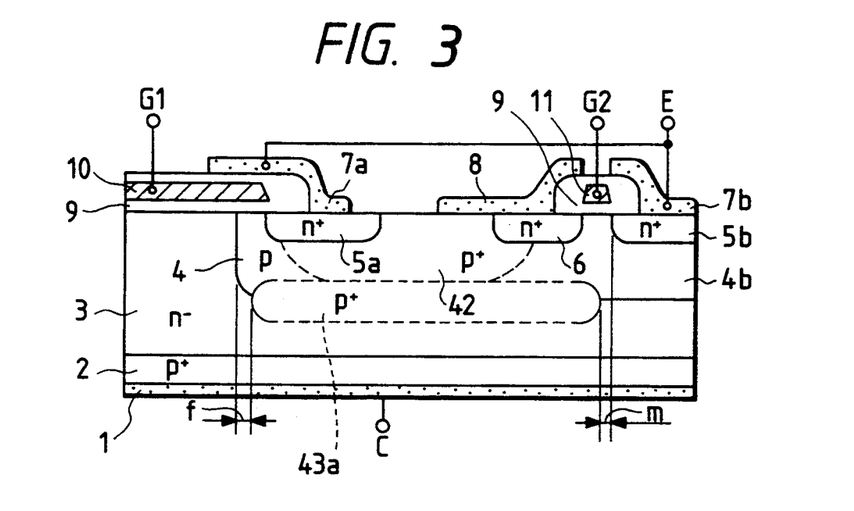
FIG. 3 is a cross-sectional view of essential portions for explaining a semiconductor device in accordance with a second embodiment of the present invention.

FIG. 3 is a cross-sectional view illustrating a semiconductor device in accordance with a second embodiment of the present invention. It should be noted that the semiconductor device of this second embodiment is fabricated in steps similar to those of FIGS. 2(a) to 2(d).

In the semiconductor device of the second embodiment, the difference with the first embodiment lies in that the p+-type buried layer (the buried layer of the first conductivity type) 43a is extended to the lower sides of the gate electrodes 10 and 11 of Q1 and Q2.

In a conventional case, when p+-type diffused layers 41 and 42 are formed to lower conductivity in the base layer 4b, an impurity is introduced from the surface, so that it has been necessary to pay an attention in view of lateral diffusion to ensure that the end of the p+-type diffused layer 41 does not reach the channel layer so as not to increase the threshold value of the channels of Q1 and Q2 over a predetermined value. For this reason, it has been necessary to provide certain room in a horizontal distance f from the end of the base layer 4b to an end of the deepest portion of the p+-type diffused layer 41 and in a horizontal distance m from an end of the n+ layer 5b below the second electrode 11 to an end of the deepest portion of the p+-type diffused layer 41.

However, in the second embodiment, after the p+-type high-concentration layer 431 is formed on the substrate, the p+-type high-concentration layer 431 is allowed to diffuse outwardly in the n⁻-type layer 3 by heating when the n⁻-type layer 3 is epitaxially grown, thereby forming the p+-type outwardly diffused layer 432 adjacent to the p+-type high-concentration layer 431. As a result, the p+-type buried layer 43a is formed. Accordingly, when this p+-type buried layer 43a is formed, the diffusion of the impurity is prevented from affecting each channel, so that it is possible to provide the relation such as f=m=0.

Accordingly, by extending the p+-type buried layer 43a to the lower side of Q1 as in the second embodiment, it is possible to prevent the concentration of the current and reduce the equivalent resistance $R_{B1}$ more effectively, and it is possible to prevent the voltage drop in the base layer 4b of Q4 and Q5 more effectively.

Furthermore, by extending the p+-type buried layer 43a to the lower side of Q2, the current during the transistor operation can be dispersed, and the equivalent resistance $R_{B1}$ can be reduced, so that the voltage drop in the base layer 4b of Q4 and Q5 can be prevented.

Consequently, in the same way as in the first embodiment, it is possible to prevent a latch-up during the transistor operation more reliably and further reduce the switching time from the thyristor operation to the transistor operation.

As examples of structural dimensions in which the present invention is applied to a double-gate MOS of 1200 V and 50 A class, the thickness of the p+-type layer 2 is 400 μm; the n+-type base layer (not shown) for reducing the off time during the operation of a transistor provided between the n−-type layer 3 and the p+-type layer 2 is approximately 20 μm; the thickness of the n−-type layer 31 is 100 μm; the thickness of the epitaxially grown n−-type layer 32 is 5 μm; and the thickness of a chip having these layers as component elements in the depthwise direction is approximately 500 μm.

As for f, when f<0, i.e., if the p+-type buried layer 43 projects toward the n−-type layer, the withstand voltage of the pn junction drops, and it becomes impossible to obtain a predetermined characteristic. Accordingly, it is preferable to form f at least such that f>0. The principal hole current in the DC operation of the transistor flows along the lower side of the p+-type buried layer 43 within the emitter layer 2 of Q3 and the base layer 3 of Q3 and along the flow path of electrons, passes through the pn junction between the base layer 3 of Q3 and the base layer 4b of Q4 at the lower side of the channel of Q1, flows across the base layer 4b of Q4, and flows to the shortcircuiting electrode 8. In the base layer 4b of Q4 and Q5, since the hole current is liable to flow in the low resistance portion, i.e., in a central portion of the p+-type buried layer 43, the hole current does not flow in this region in a concentrated manner, but is capable of flowing in a diffused manner.

Furthermore, with respect to m, since the p+-type buried layer 43 is formed by burying, the p+-type buried layer 43 does not affect the channel of Q2 and can be made to extend to the lower side of the channel of Q2. To ensure that the quadruple pnpn channel layer for the main current during the thyristor operation is formed at the lower side of the n+-type layer 5b, and that a sufficiently low on voltage is obtained during the thyristor operation, it is preferred that m is not set such that m<0, i.e, the p+-type buried layer 43 is not formed to the lower side of the n+-type layer 5b. The flow paths of the hole current during the transistor operation under an L load include the flow path at the lower side of the n+-type layer 5b in addition to the flow paths during the DC operation. That is, holes flow through the p-type emitter layer 2 and the n−-type base layer 3, cross the pn junction between the p-type emitter layer 2 and the n−-type base layer 3 at the lower side of the n+-type layer 5b, flow at the lower side of Q2 in the p-type base layer 4b, flow at the lower side of the n+-type layer 6, join with a hole current from the n+-type layer 5a side, flow through the region surrounded by the n+-type layers 5a and 6, flow into the shortcircuiting electrode 8, and are replaced by electrons. Accordingly, the more enlarged the p+-type buried layer 43 is at the lower side of 5b, the more the hole current flows in a diffused manner for the same reason as stated above, and the smaller the equivalent resistance $R_{B1}$ is. Therefore, the p+-type buried layer 43 operates in a direction in which a latch-up is difficult to occur, with the result that this arrangement is suitable for applications permitting an even greater current. Art equivalent circuit at this time is shown in FIG. 4(b). Q3 is the pnp bipolar transistor at the lower side of Q2, and the route of the principal hole current leading from Q3 to Q2 is divided into two.

In addition, as another embodiment, the concentrations of the p-type layer 4b at the lower side of Q1 and of the p-type layer 4b at the lower side of Q2 may be formed independently. In this case, there is a merit in that threshold values of Q1 and Q2 can be controlled independently.

Furthermore, although the above-described embodiment is applied to a case where the semiconductor device is operated as a device of the double-gate MOS type, i.e., to a case where the thyristor mode and the transistor mode are operated alternately, the semiconductor device having the same configuration as that of the above-described embodiment may be used to operate in the transistor mode only.

In addition, the present invention is not limited to the embodiments, and is applicable to an IGBT, a MOSFET, a bipolar transistor, or other similar semiconductor device.

As described above, the present invention is characterized in that a buried layer of a first conductivity type having an impurity concentration higher than that in a second layer of the first conductivity type is present in at least a lower region between a second layer of a second conductivity type and a third layer of the second conductivity type in the vicinity of a boundary between the second layer of the first conductivity type and a first layer of the second conductivity type. Thus, the conductivity in the vicinity of the boundary between the second layer of the first conductivity type and the first layer of the second conductivity type drops below conductivity in the second layer of the first conductivity type located above the buried layer of the first conductivity type. Hence, the current flowing through the second layer of the first conductivity type spreads in the entire second layer of the first conductivity type as compared with a comparison example in which most of the current flows through an upper portion in proportion to an impurity concentration. As a result, since the concentration of the current in the second layer of the first conductivity type can be prevented, and an equivalent resistance $R_B$ can be reduced, it is possible to prevent a voltage drop in this region. Accordingly, in a case where, for instance, the second layer of the first conductivity type is used as base layers of second and third bipolar transistors Q4 and Q5, it is possible to prevent a latch-up in which a thyristor comprised of Q4 and Q3 as well as Q5 and Q3 undergoes abnormal operation as Q4 and Q5 are turned on during the transistor operation when Q3 is turned on. In addition, since the current carrier remaining in the base layers of Q4 and Q5 can be drawn quickly, the switching time from the thyristor operation to the transistor operation when the above-described thyristor undergoes normal operation can be reduced further.

In addition, since the concentration of the current can be prevented more effectively and the equivalent resistance $R_B$ can be reduced by expanding a buried layer of the first conductivity type to the lower side of Q1, it is possible to prevent a voltage drop in this region more effectively. As a result, during the transistor operation, it is possible to prevent a latch-up more reliably, and the switching time from the thyristor operation to the transistor operation can be reduced further.

Furthermore, by expanding the buried layer of the first conductivity type to the lower side of Q2, the current during the transistor operation at the time of inductance load can be dispersed, and the equivalent resistance $R_B$ can be reduced, so that it is possible to prevent a voltage drop in this region. Consequently, it is possible to prevent a latch-up during the transistor operation, and the switching time from the thyristor operation to the transistor operation can be reduced further.

As additional advantages on improvement of other characteristics, in accordance with the present invention, it is possible to attain improvement of a reverse-bias safety operation area (RBSOA) and improvement of a load shortcircuiting withstanding capacity.

What is claimed is:

1. A semiconductor device, comprising:
   a first layer of a first conductivity type;
   a first layer of a second conductivity type formed on said first layer of the first conductivity type;
   a second layer of the first conductivity type formed selectively in said first layer of the second conductivity type;
   a second layer of the second conductivity type formed selectively in a surface layer of said second layer of the first conductivity type with a predetermined interval from an interface between said second layer of the first conductivity type and said first layer of the second conductivity type;
   a third layer of the second conductivity type formed in the surface layer of said second layer of the first conductivity type by being spaced apart from said second layer of the second conductivity type;
   a fourth layer of the second conductivity type formed in the surface layer of said second layer of the first conductivity type with a predetermined interval from said third layer of the second conductivity type;
   a first electrode formed via an insulating film on a surface of said second layer of the first conductivity type disposed between said first layer of the second conductivity type and said second layer of the second conductivity type;
   a second electrode formed via an insulating film on the surface of said second layer of the first conductivity type disposed between said third layer of the second conductivity type and said fourth layer of the second conductivity type;
   a third electrode connected to said second layer of the second conductivity type;
   a fourth electrode connected to said third electrode and connected to said fourth layer of the second conductivity type;
   a fifth electrode connecting said third layer of the second conductivity type with said second layer of the first conductivity type; and
   a buried layer of the first conductivity type having an impurity concentration higher than that of said second layer of the first conductivity type, said buried layer being disposed in at least a lower region between said second layer of the second conductivity type and said third layer of the second conductivity type in a vicinity of a boundary between said second layer of the first conductivity type and said first layer of the second conductivity type.

2. A semiconductor device according to claim 1, further comprising an impurity-introduced layer of the first conductivity type abutting at least said second layer of the second conductivity type and said third layer of the second conductivity type, said impurity-introduced layer being formed by introducing an impurity of the first conductivity type from the surface of said second layer of the first conductivity type into said second layer of the first conductivity type interposed between said second layer of the second conductivity type and said third layer of the second conductivity type.

3. A semiconductor device according to claim 1 or 2, wherein said buried layer of the first conductivity type has one end extending to a portion located below said first electrode and the other end extending to a portion located below said second electrode.

4. A semiconductor device according to claim 1 or 2, wherein:
   said first layer of the first conductivity type is an emitter layer of a first bipolar transistor;
   said first layer of the second conductivity type is a first source/drain region layer of a first insulated gate field effect transistor, a base layer of said first bipolar transistor, and collector layers of a second bipolar transistor and a third bipolar transistor, respectively;
   said second layer of the first conductivity type is back gates of said first insulated gate field effect transistor and a second insulated gate field effect transistor, a collector layer of said first bipolar transistor, and base layers of said second bipolar transistor and said third bipolar transistor, respectively;
   said second layer of the second conductivity type is a second source/drain region layer of said first insulated gate field effect transistor and an emitter layer of said second bipolar transistor;
   said third layer of the second conductivity type is a second source/drain region layer of said second insulated gate field effect transistor;
   said fourth layer of the second conductivity type is a first source/drain region layer of said second insulated gate field effect transistor and an emitter layer of said third bipolar transistor; and
   said first and second electrodes are gate electrodes of said first and second insulated gate field effect transistors, respectively.

* * * * *